United States Patent
Yamamoto et al.

(10) Patent No.: US 10,639,727 B2
(45) Date of Patent: May 5, 2020

(54) VACUUM SUCTION PAD AND SUBSTRATE HOLDER

(71) Applicant: EBARA CORPORATION, Tokyo (JP)

(72) Inventors: Satoru Yamamoto, Tokyo (JP);
Masayuki Nakanishi, Tokyo (JP);
Kenji Kodera, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/940,399

(22) Filed: Mar. 29, 2018

(65) Prior Publication Data
US 2018/0286772 A1    Oct. 4, 2018

(30) Foreign Application Priority Data

Mar. 31, 2017    (JP) ................. 2017-070755

(51) Int. Cl.
| | | |
|---|---|---|
| *B23B 31/30* | (2006.01) | |
| *H01L 21/683* | (2006.01) | |
| *B24B 37/30* | (2012.01) | |
| *B24B 41/06* | (2012.01) | |

(52) U.S. Cl.
CPC ........ *B23B 31/307* (2013.01); *H01L 21/6838* (2013.01); *B24B 37/30* (2013.01); *B24B 41/068* (2013.01); *Y10T 279/11* (2015.01)

(58) Field of Classification Search
CPC .. B23B 31/307; H01L 21/6838; Y10T 279/11
See application file for complete search history.

(56) References Cited

U.S. PATENT DOCUMENTS

| | | | | | |
|---|---|---|---|---|---|
| 2,730,370 | A | * | 1/1956 | Brewster | B23B 31/307 264/571 |
| 5,534,073 | A | * | 7/1996 | Kinoshita | B25B 11/005 118/725 |
| 7,033,445 | B2 | * | 4/2006 | Keeton | H01L 21/67103 118/500 |
| 9,177,849 | B2 | * | 11/2015 | Kelekar | H01L 21/6838 |
| 2010/0267317 | A1 | | 10/2010 | Takahashi et al. | |
| 2014/0161582 | A1 | * | 6/2014 | Maffeis | B25J 15/0616 414/800 |
| 2017/0053822 | A1 | * | 2/2017 | Ben Natan | H01L 21/6838 |

FOREIGN PATENT DOCUMENTS

JP    2010-153585 A    7/2010

* cited by examiner

*Primary Examiner* — Eric A. Gates
*Assistant Examiner* — Chwen-Wei Su
(74) *Attorney, Agent, or Firm* — BakerHostetler

(57) ABSTRACT

A vacuum suction pad capable of making it more difficult to separate a substrate when the substrate is held by vacuum suction, the vacuum suction pad 8 including: a pad main body 37 having a lower surface adhered to a stage 5 of a substrate holder 2; and a plurality of circular arc-shaped substrate holding convexities 38, provided on a top surface of the pad main body 37, for holding a substrate W attracted by vacuum suction to the top surface of the pad main body 37, wherein the substrate holding convexities 38 are arranged concentrically with the circular pad main body 37, and width W1 in a radial direction of the substrate holding convexity 38 located on a radially outer side among the plurality of substrate holding convexities 38 is narrower than width W2 in the radial direction of the substrate holding convexity 38 on a radially inner side.

15 Claims, 21 Drawing Sheets

PRIOR ART

FIG. 9

|  | Conventional Pad | Example | Comparative Example |
|---|---|---|---|
| Vacuum-Area Area Ratio (%) | 100 | 112.9 | 108.7 |
| Suction Force Ratio (%) | 100 | 128 | 102.5 |
| Warp Amount of Substrate (mm) | 1.14 | 1.06 | 1.12 |
| Reduction in Warp of Substrate (%) | 0 | 9.0 | 1.8 |

VACUUM SUCTION PAD AND SUBSTRATE HOLDER

CROSS-REFERENCE TO RELATED APPLICATION

This application is based upon and claims benefit of priority from Japanese Patent Application No. 2017-070755 filed on Mar. 31, 2017, the entire contents of which are incorporated herein by reference.

BACKGROUND OF THE INVENTION

Field of the Invention

The present invention relates to a vacuum suction pad to be adhered to a stage of a substrate holder.

Description of the Related Art

A vacuum suction pad is adhered to a stage of a substrate holder and is used for holding a substrate on the stage by vacuum suction (see, for example, Japanese Patent Laid-Open No. 2010-153585). A plurality of closed sections (vacuum suction areas) surrounded by convexities are formed on a suction surface (top surface) of a conventional vacuum suction pad. Each of the plurality of closed sections is provided with an intake/exhaust port, and a plurality of the intake/exhaust ports are connected to intake/exhaust lines that can independently take in and exhaust air, respectively. Moreover, a plurality of circular arc-shaped substrate holding convexities for holding the substrate are concentrically arranged in the plurality of closed sections.

For example, when polishing a substrate with a substrate polishing apparatus, the substrate is polished while holding the substrate by vacuum suction on the stage of a substrate holder. Specifically, the substrate is polished by rotating the substrate held on the stage of the substrate holder and rotating the substrate polishing apparatus while pressing a polishing pad of the substrate polishing apparatus against the substrate. In order to polish the rear surface of the substrate, a contact member, for example, the polishing head is pressed from the lower side of an outer circumferential portion of the rotating substrate so that a force in a direction opposite to a downward force applied to near the central portion of the substrate when the substrate is held on the stage, that is, an upward force is applied to the substrate, and consequently the outer circumferential portion of the substrate is warped upward by the force. This tendency is noticeable when such a process is performed on a substrate thinner than a conventional substrate, such as a support substrate which is applied to a TSV process whose use is increasing in recent years. With the conventional vacuum suction pad, vacuum suction is broken as the amount of warping increases, and the substrate is easily separated from the stage (especially from the radially outer side of the substrate).

In order to prevent separation of the substrate from the stage, it is conceivable to improve the suction force during vacuum suction. For example, it is conceivable to increase the degree of vacuum (lower the pressure) in the vacuum suction, but it is difficult to adopt this idea because increasing the degree of vacuum more than necessary deteriorates the releasability of the substrate after vacuum suction.

The present invention has been made in view of the above drawbacks, and it is an object of the present invention to provide a vacuum suction pad capable of making it more difficult to separate a substrate when the substrate is held by vacuum suction and also capable of maintaining the releasability after vacuum suction.

SUMMARY OF THE INVENTION

A vacuum suction pad according to the present invention includes: a pad main body having a lower surface to be adhered to a stage of a substrate holder; and a plurality of circular arc-shaped substrate holding convexities, provided on a top surface of the pad main body, for holding a substrate to be held by vacuum suction on the top surface of the pad main body, wherein the circular arc-shaped substrate holding convexities are arranged concentrically with the pad main body having a circular shape, and a width, in a radial direction, of the substrate holding convexity located on a radially outer side among the plurality of circular arc-shaped substrate holding convexities is smaller than a width, in the radial direction, of the substrate holding convexity located on a radially inner side.

According to this configuration, while the width in the radial direction of the substrate holding convexity located on the radially inner side is the same as that of a conventional vacuum suction pad, the width on the outer side is set relatively narrower and thereby expanding the area of a vacuum portion. This makes it possible to reduce the amount of upward warping of the substrate due to the force of the polishing head and increase the suction force, and thereby preventing separation of the substrate. At this time, even if the width on the radially inner side is made narrower than that of the conventional pad to expand the area of the vacuum portion on the inner side, almost no influence is exerted on the outer circumferential portion, and thus the effect cannot be expected. Therefore, by reducing only the width on the radially outer side, it is also possible to minimize the downward warping of the substrate which is caused by narrowing the width.

In the vacuum suction pad of the present invention, a coating layer having substrate releasability may be formed on the top surface of the pad main body.

According to this configuration, since the coating layer that comes into contact with the substrate has substrate releasability, the substrate is easily separated after terminating vacuum suction (for example, after polishing the substrate).

Further, the vacuum suction pad of the present invention may include an area forming convexity, provided on the top surface of the pad main body, for dividing the top surface of the pad main body into a plurality of vacuum suction areas in the radial direction, wherein the vacuum suction area on the radially outer side is provided with a first intake/exhaust port to be connected to a first intake/exhaust line of the substrate holder, and the vacuum suction area on the radially inner side is provided with a second intake/exhaust port to be connected to a second intake/exhaust line of the substrate holder.

According to this configuration, the vacuum pressure when holding the substrate by vacuum suction can be different in the vacuum suction area on the radially outer side and in the vacuum suction area on the radially inner side. In other words, by arbitrarily increasing the vacuum pressure only on the radially outer side of the substrate to increase the suction force and make it more difficult to separate the substrate being held by vacuum suction (for example, during polishing the substrate) and by decreasing the vacuum pressure on the radially inner side, it is possible to keep the whole balance and maintain the releasability of the substrate after vacuum suction.

In the vacuum suction pad of the present invention, the substrate holding convexities may include a contact portion that comes into contact with the substrate, and a root portion that supports the contact portion, wherein the width, in the radial direction, of the contact portion is set wider than the width, in the radial direction, of the root portion.

According to this configuration, vacuum can be increased while keeping the area of contact between the substrate and the vacuum suction pad, and thus it is possible to make it more difficult to separate the substrate while preventing downward warping of the substrate.

In the vacuum suction pad of the present invention, the substrate holding convexities may include a contact portion that comes into contact with the substrate, and a root portion that supports the contact portion, wherein the width, in the radial direction, of the contact portion is set narrower than the width, in the radial direction, of the root portion.

According to this configuration, it is possible to make it more difficult to separate a substrate, particularly a substrate which is less susceptible to downward warping, while decreasing the degree of contamination of the rear surface of the substrate by reducing the area of contact between the substrate and the vacuum suction pad.

In the vacuum suction pad of the present invention, the substrate holding convexity may have a circular cross-sectional shape.

According to this configuration, it is possible to make it more difficult to separate a substrate, particularly a substrate which is less susceptible to downward warping, while decreasing the degree of contamination of the rear surface of the substrate by reducing the area of contact between the substrate and the vacuum suction pad.

A substrate holder of the present invention includes a stage for holding a substrate, and a vacuum suction pad to be adhered to the stage, the vacuum suction pad including: a pad main body having a lower surface to be adhered to the stage; and a plurality of circular arc-shaped substrate holding convexities, provided on a top surface of the pad main body, for holding a substrate to be held by vacuum suction on the top surface of the pad main body, wherein the circular arc-shaped substrate holding convexities are arranged concentrically with the pad main body having a circular shape, and a width, in a radial direction, of the substrate holding convexity located on a radially outer side among the plurality of circular arc-shaped substrate holding convexities is narrower than a width, in the radial direction, of the substrate holding convexity located on a radially inner side.

According to this configuration, the width in the radial direction of the substrate holding convexity located on the radially inner side is the same as that of a conventional vacuum suction pad, but the width is set relatively narrower on the outer side and the area of a vacuum portion becomes larger compared to that of the conventional pad. This makes it possible to reduce the amount of upward warping of the substrate due to the force of the polishing head and increase the suction force, and thereby preventing separation of the substrate. At this time, even if the width on the radially inner side is made narrower than that of the conventional pad to expand the area of the vacuum portion on the inner side, almost no influence is exerted on the outer circumferential portion, and the effect cannot be expected. Therefore, by reducing only the width on the radially outer side, it is also possible to minimize the downward warping of the substrate which is caused by narrowing the width.

According to the present invention, it is possible to make it more difficult to separate the substrate when the substrate is being held by vacuum suction while maintaining the releasability after vacuum suction.

BRIEF DESCRIPTION OF THE DRAWINGS

FIG. 9 is a table showing the effects of the vacuum suction pad according to the embodiment of the present invention;

DETAILED DESCRIPTION OF THE PREFERRED EMBODIMENTS

The following will describe a vacuum suction pad according to an embodiment of the present invention with reference to the drawings. In this embodiment, an example of a vacuum suction pad for attracting by vacuum suction a thin plate-like substrate, such as a semiconductor wafer, will be described.

First Embodiment

Figure 1:
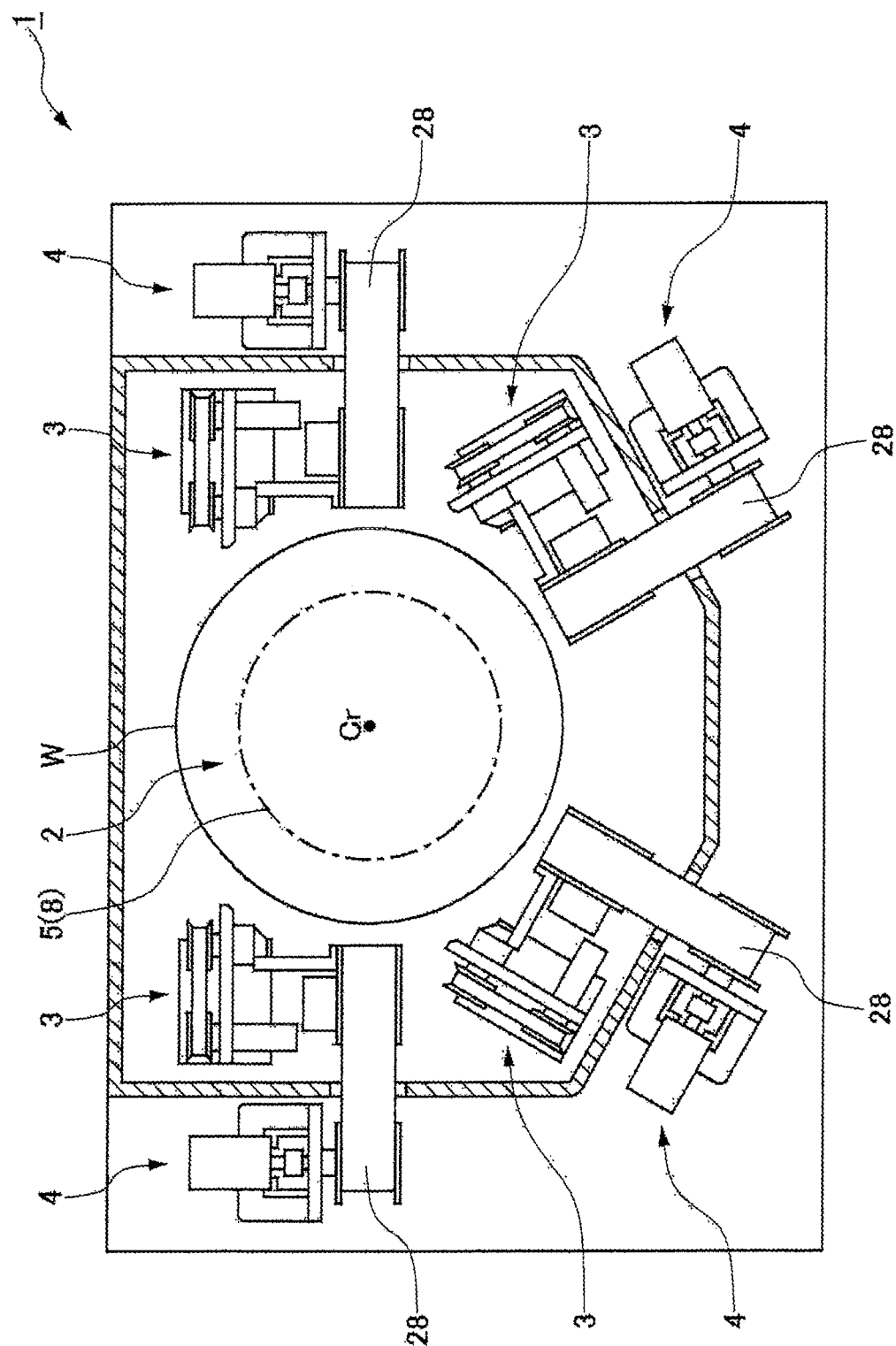
FIG. 1 is a plan view of a polishing apparatus including a substrate holder according to an embodiment of the present invention.
Figure 2:
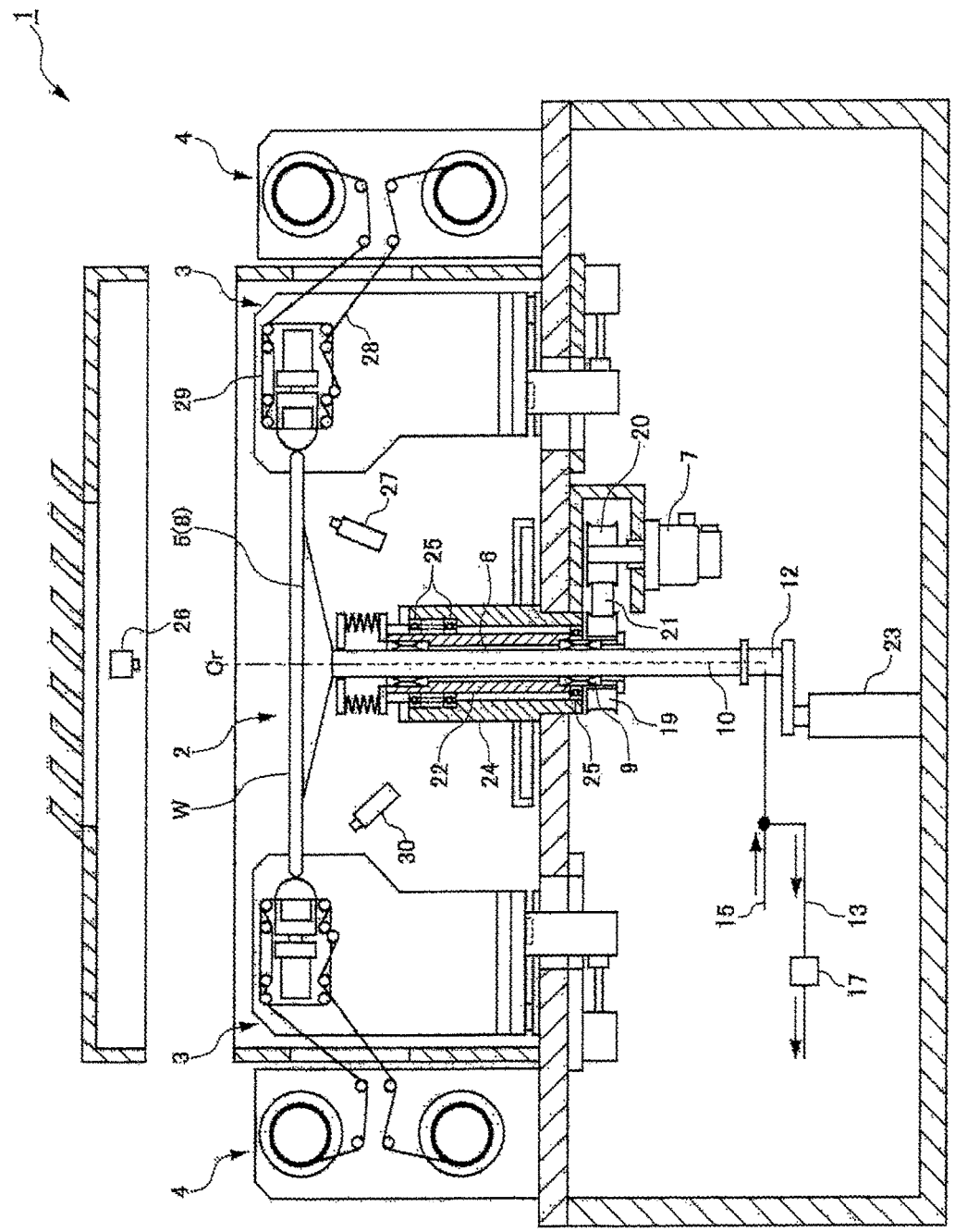
FIG. 2 is a cross-sectional view of the polishing apparatus including the substrate holder according to the embodiment of the present invention.

First, the configuration of a substrate holder according to an embodiment of the present invention will be described with reference to the drawings. FIG. 1 is a plan view of a polishing apparatus including the substrate holder of this embodiment, and FIG. 2 is a cross-sectional view of the polishing apparatus including the substrate holder of this embodiment. As illustrated in FIG. 1 and FIG. 2, a substrate holder 2 for holding horizontally a substrate W, which is an object to be polished, is mounted in the central portion of a polishing apparatus 1. Four polishing head mechanisms 3 are disposed around the substrate W held by the substrate holder 2, and a polishing tape supply and collection mechanism 4 is provided on the outside, in a radial direction, of each of the polishing head mechanisms 3.

The substrate holder 2 includes a stage 5 for placing a substrate W thereon, a rotating shaft 6 connected to the central portion of the stage 5, and a motor 7 for rotating the rotating shaft 6. A vacuum suction pad 8 is adhered to the stage 5 of the substrate holder 2, and the substrate W is placed on the vacuum suction pad 8 by a transport arm of a transport mechanism so that the center of the substrate W coincides with the axial center of the rotating shaft 6.

The rotating shaft 6 of the substrate holder 2 is supported by a ball spline bearing 9 (linear-motion bearing) so as to be freely movable up and down. A first tube 10 is inserted into the rotating shaft 6. The first tube 10 is connected to a first vacuum line 13, which is a vacuum source, through a rotary joint 12 attached to the lower end of the rotating shaft 6. The first tube 10 is also connected to a first nitrogen gas supply line 15 which is a fluid supply source for releasing the substrate W from the vacuum suction pad 8 after a process.

The first vacuum line 13 is provided with a first vacuum regulator 17, and the degree of vacuum is adjusted according to a signal from a control unit (not shown). In the substrate holder 2, the first vacuum line 13 or the first nitrogen gas supply line 15 is selectively connected to the first tube 10. When releasing the substrate W, a valve (not shown) of the first vacuum line 13 communicating with a vacuum source (not shown) is closed from the open state to disconnect the first vacuum line 13 and the first tube 10, whereas a valve (not shown) of the nitrogen gas supply line 15 is opened from the closed state to communicate the first tube 10 and the nitrogen gas supply line 15, and, in this state, nitrogen gas supplied from a nitrogen gas supply source (not shown) is supplied to the first tube 10 through the nitrogen gas supply line 15. Alternatively, in the case where the vacuum source (not shown) communicating with the vacuum line 13 is a pump, the operation of the pump is stopped and then, in this state, the nitrogen gas supplied from the nitrogen gas supply source (not shown) is supplied to the first tube 10 through the gas supply line 15. The substrate holder 2 is configured such that the substrate W is adhered by vacuum suction to the top surface of the vacuum suction pad 8 by supplying a vacuum pressure to the substrate W, and the substrate W is released from the top surface of the vacuum suction pad 8 by supplying nitrogen gas to the substrate W.

The rotating shaft 6 of the substrate holder 2 is rotated by the motor 7 through a pulley 19 connected to the rotating shaft 6, a pulley 20 attached to the rotating shaft of the motor 7, and a belt 21 wound around the pulleys 19 and 20. The rotating shaft of the motor 7 extends in parallel with the rotating shaft 6 of the substrate holder 2. With such a configuration, the substrate W held on the top surface of the vacuum suction pad 8 is rotated by the motor 7.

The ball spline bearing 9 is a bearing that allows the rotating shaft 6 of the substrate holder 2 to freely move in the longitudinal direction. The ball spline bearing 9 is fixed to an inner casing 22. The rotating shaft 6 is capable of moving up and down linearly with respect to the inner casing 22, and the rotating shaft 6 and the inner casing 22 rotate integrally. The rotating shaft 6 is connected to an air cylinder (elevating mechanism) 23 so that the rotating shaft 6 and the vacuum suction pad 8 are elevated and lowered by the air cylinder 23.

A radial bearing 25 is interposed between the inner casing 22 and an outer casing 24 arranged concentrically on the outside of the inner casing 22, and the inner casing 22 is rotatably supported by the radial bearing 25. With such a configuration, the substrate holder 2 can rotate the substrate W about a central axis Cr and can elevate and lower the substrate W along the central axis Cr.

In a state in which the rotating shaft 6 of the substrate holder 2 is lowered, the substrate W held on the vacuum suction pad 8 by vacuum suction is polished (see FIG. 2). After the polishing process, the substrate W is elevated to a transport position together with the vacuum suction pad 8 and the rotating shaft 6 by the air cylinder 23, and the substrate W is released from the vacuum suction pad 8 at this transport position.

As illustrated in FIG. 2, in the substrate holder 2, an upper supply nozzle 26 is disposed above the substrate W. During polishing of the substrate W, a polishing liquid is supplied from the upper supply nozzle 26 toward the center of the top surface of the substrate W held by the substrate holder 2. Moreover, the substrate holder 2 is provided with a lower supply nozzle 27 for supplying a polishing liquid toward a boundary portion between the rear surface of the substrate W and the vacuum suction pad 8 of the substrate holder 2 (the outer circumferential portion of the vacuum suction pad 8). Pure water is usually used as the polishing liquid, but it is also possible to use ammonia when silica is used as abrasive grains for a polishing tape (polishing tool) 28.

Further, the polishing apparatus 1 includes a cleaning nozzle 30 for cleaning a polishing head 29 after the polishing process. After the substrate W is elevated by the substrate holder 2 after the polishing process, the cleaning water is sprayed toward a polishing head 3 to wash the polishing head 3 after the polishing process.

Figure 3:
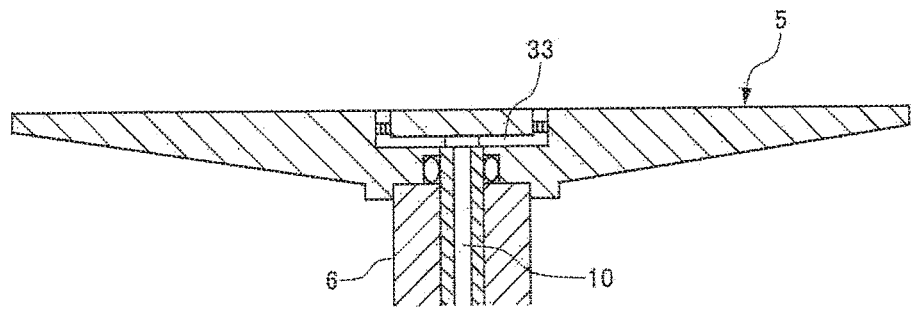
FIG. 3 is an explanatory view of a stage of the substrate holder according to the embodiment of the present invention.

FIG. 3 is a cross-sectional view illustrating the configuration of the stage 5 of the substrate holder 2. As illustrated in FIG. 3, the first tube 10 is connected to the stage 5 of the substrate holder 2. The stage 5 is rotatable together with the rotating shaft 6 of the substrate holder 2. Further, a first intake/exhaust line 33 is formed inside the stage 5. The first intake/exhaust line is connected to the first tube 10.

Figure 11:
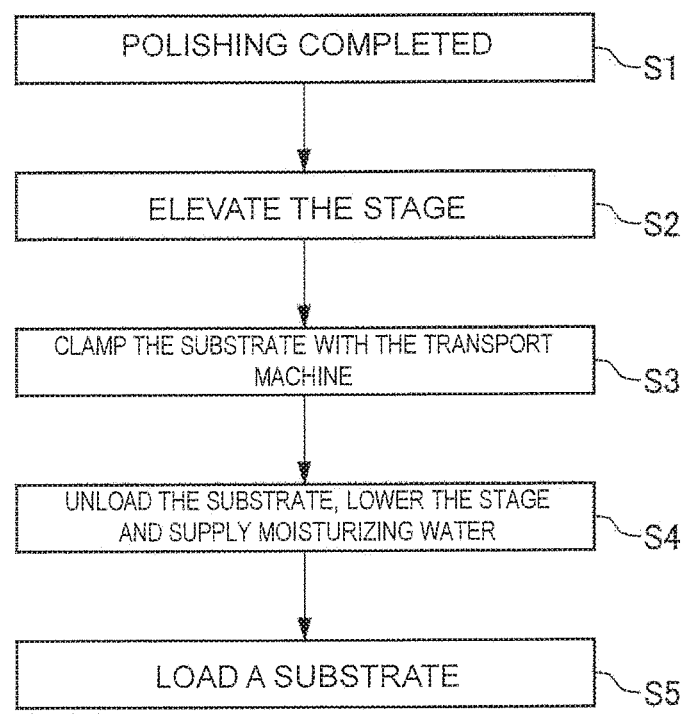
FIG. 11 is a flowchart showing a flow of operations of the substrate holder according to the embodiment of the present invention.

Next, operations of the substrate holder 2 of this embodiment will be described with reference to the drawings. FIG. 11 is a flowchart showing the flow of operations after substrate polishing is completed. As shown in FIG. 11, in this embodiment, when a polishing operation on the substrate W is completed (S1), the stage 5 of the substrate holder is elevated (S2), and the substrate W (the substrate W after completion of polishing) on the stage 5 is clamped with a transport machine (S3). Then, the substrate W is unloaded, the stage 5 of the substrate holder 2 is lowered, and moisturizing water is supplied (S4). Thereafter, the next substrate W (the substrate W which has not been polished and is going to be polished now) is loaded (S5).

The moisturizing water is pure water (DIW) which is supplied for refreshing the top of the stage 5 (the top of the vacuum suction pad 8) every time the substrate W is transported. By supplying the moisturizing water at the time the substrate is unloaded, it is possible to prevent the moisture water scattered on the vacuum suction pad 8 from adhering to the dry substrate W before the polishing process, thereby avoiding occurrence of water spots.

Figure 4:
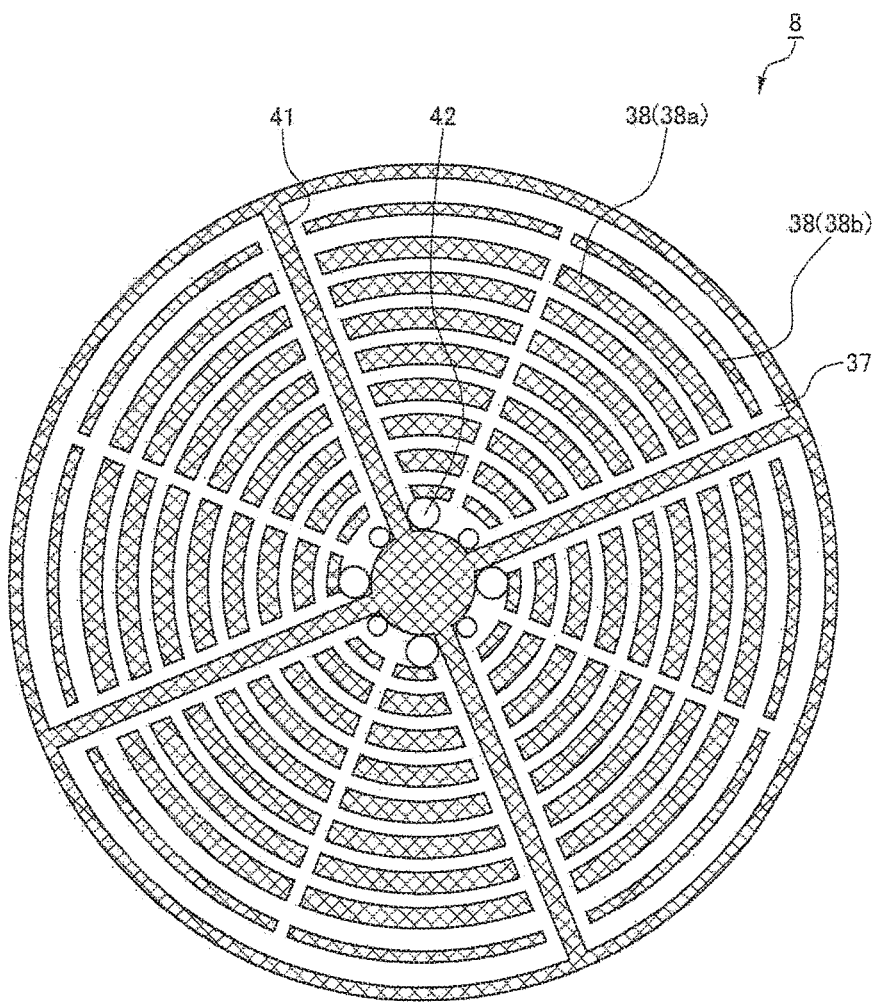
FIG. 4 is a plan view of a vacuum suction pad according to an embodiment of the present invention.
Figure 5:
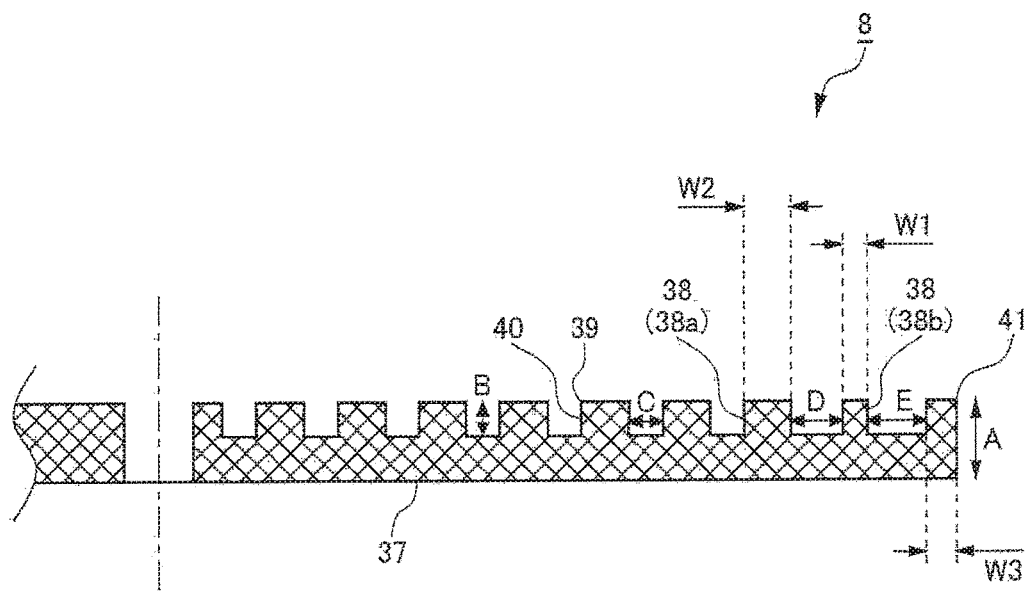
FIG. 5 is a cross-sectional view of the vacuum suction pad according to the embodiment of the present invention.

Next, the configuration of the vacuum suction pad 8 will be described. FIG. 4 is a plan view of the vacuum suction pad 8, and FIG. 5 is a cross-sectional view of the vacuum suction pad 8. As illustrated in FIG. 4 and FIG. 5, the vacuum suction pad 8 includes a pad main body 37 having a circular shape in a plan view, and a plurality of circular arc-shaped substrate holding convexities 38 provided on the top surface of the pad main body 37. The lower surface of the pad main body 37 is adhered to the surface (top surface) of the stage 5 of the substrate holder 2. The substrate holding convexities 38 have a function of holding the substrate W attracted by vacuum suction to the top surface of the pad main body 37.

Figure 6:
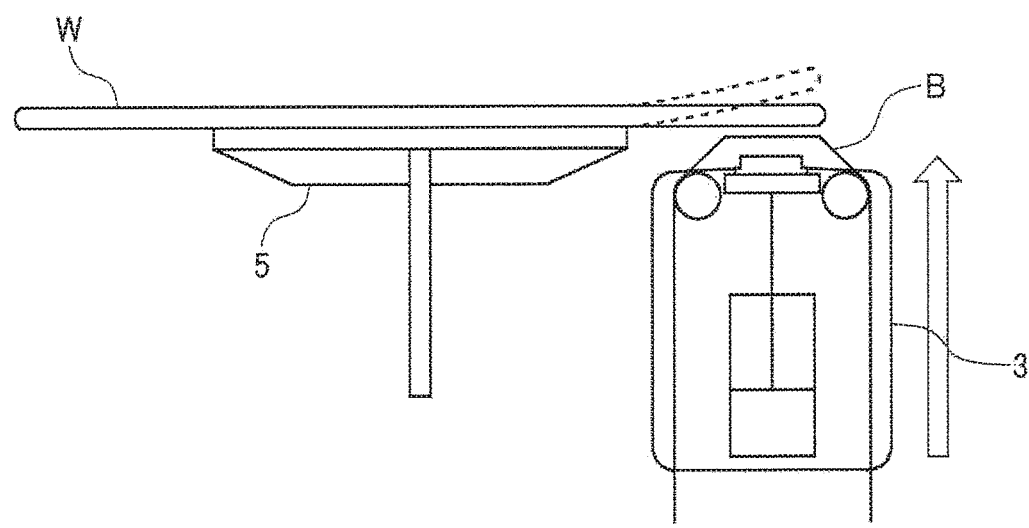
FIG. 6 is an explanatory view of a mechanism of separation of the substrate during polishing.

As illustrated in FIG. 6, the polishing head 3 presses a polishing tape B against the substrate W to perform polishing. However, when the polishing head 3 is pressed from the lower side, there is a possibility that the substrate W warps upward, the vacuum suction with the vacuum suction pad 8 is broken, and the substrate W is separated during polishing. The thinner the substrate W, the more noticeable the warping of the substrate W, and therefore the vacuum suction pad 8 needs to have a structure capable of preventing separation of even a thin substrate.

As illustrated in FIG. 4, the plurality of circular arc-shaped substrate holding convexities 38 are arranged concentrically with the circular pad main body 37. A width W1, in a radial direction, of the substrate holding convexity 38 (substrate holding convexity 38b) located on the outermost circumference among the plurality of circular arc-shaped substrate holding convexities 38 is set narrower than a width W2, in the radial direction, of the substrate holding convexity 38 (substrate holding convexity 38a) located on the radially inner side (see FIGS. 4 and 5). A width E, in the radial direction, between an area forming convexity 41 and the outermost substrate holding convexity 38b and a distance D, in the radial direction, between the outermost substrate holding convexity 38b and the substrate holding convexity 38a located inwardly next to the outermost substrate holding convexity 38b are set greater than a width C, in the radial direction, between the substrate holding convexities 38a located further inward (see FIGS. 4 and 5).

In this embodiment, among the plurality of circular arc-shaped substrate holding convexities 38, although the width W1 in the radial direction of the substrate holding convexity 38b located on the outermost circumference is set narrower than the width W2 in the radial direction of the substrate holding convexity 38a located on the radially inner side, it is just necessary that the width W1 of any substrate holding convexity 38b located on the radially outer side is narrower than the width W2 in the radial direction of other substrate holding convexities 38a among the plurality of circular arc-shaped substrate holding convexities 38, and the technical idea of the present invention is not limited to the embodiment in which only the width of the substrate holding convexity 38b on the outermost circumference is narrowed. Moreover, the technical idea of the present invention is not limited to the settings in which the width E in the radial direction between the area forming convexity 41 and the outermost substrate holding convexity 38b and the distance D in the radial direction between the outermost substrate holding convexity 38b and the substrate holding convexity 38a located inwardly next to the outermost substrate holding convexity 38b are wider than the width C in the radial direction between the substrate holding convexities 38a located further inward, and thus the width E in the radial direction between any one of the substrate holding convexities 38b located on the radially outer side and the substrate holding convexity 38a located outwardly next to the one substrate holding convexity 38b can be set wider than the width C in the radial direction between other substrate holding convexities 38a on the outer side.

For example, when the diameter of the substrate W is 300 mm, the width W1 in the radial direction of the substrate holding convexity 38b located on the outermost circumference is set to 2 mm, the width W2 in the radial direction of the substrate holding convexity 38a located on the radially inner side is set to 5 mm, and a width W3 of the area forming convexity 41 is set to 3 mm. Further, the width E in the radial direction between the area forming convexity 41 and the outermost substrate holding convexity 38b is set to 8 mm, the distance D in the radial direction between the outermost substrate holding convexity 38b and the substrate holding convexity 38a located inwardly next to the outermost substrate holding convexity 38b is set to 7 mm, the width C in the radial direction between the substrate holding convexities 38a located further inward is set to 5 mm, a height B of the substrate holding convexity 38 is set to 6 mm, and a height A of the pad main body 37 is set to 12 mm.

Either one of the width W1 in the radial direction of the substrate holding convexity 38b located on the outermost circumference and the width W3 of the area forming convexity 41 may be wider than the other, or they may be of the same width. The height A of the pad main body 37 is not limited to 12 mm, and may be greater than 12 mm, or may not be greater than 12 mm. The height B of the substrate holding convexity 38 is not limited to 6 mm, and may be greater than 6 mm, or may not be greater than 6 mm. However, at least the width E in the radial direction between the area forming convexity 41 and the outermost substrate holding convexity 38b needs to be wider than the width C in the radial direction between the inner substrate holding convexities 38a located on the inner side.

As illustrated in FIG. 5, the substrate holding convexities 38 (the substrate holding convexities 38a and 38b) have a contact portion 39 (the top portion in FIG. 5) which comes into contact with the substrate W, and a root portion 40 (the lower portion in FIG. 5) supporting the contact portion 39. In this case, the width, in the radial direction, of the contact portion 39 is set equal to the width, in the radial direction, of the root portion.

On the top surface of the pad main body 37, the area forming convexity 41 for dividing the top surface of the pad main body 37 into a plurality of vacuum suction areas in a circumferential direction is provided. In the example of FIG. 4, the top surface of the pad main body 37 is divided into four vacuum suction areas by the area forming convexity 41. In each vacuum suction area, a first intake/exhaust port 42 to be connected to the first intake/exhaust line 33 of the substrate holder 2 is provided. Here, the example where the top surface of the pad main body 37 is divided into four is described, but the number of divisions into which the pad main body 37 is divided is not limited to four. For example, the top surface of the pad main body 37 may be divided into two, three, four, six, eight, ten, twelve, or sixteen areas.

In this embodiment, a rubber material such as, for example, silicone rubber, urethane rubber and acrylic rubber, a soft resin material such as, for example, polyurethane and polyester, or a conductive material is used as the material of the vacuum suction pad 8. Rubber materials or soft resin materials are preferable because they have functions of ensuring vacuum sealing performance and not easily scratching the substrate W. A conductive material is preferable because, if the substrate W is charged during polishing, the conductive material can release the electric charges on the substrate W from the vacuum suction pad 8 and thus has a function of preventing adhesion of dust to the substrate due to charging of the substrate and, in some case, preventing the substrate itself from being destroyed by static electricity.

In addition, a coating layer having substrate releasability is formed on the top surface of the pad main body 37. For example, by applying Parylene (registered trademark) coating, a coating layer having substrate releasability is formed on the top surface of the pad main body 37. It is possible to improve the substrate releasability by providing the coating layer.

Here, with reference to FIGS. 7 to 10 and 23, the following will describe the relationship between an index (suction force) of the suction pad 8 holding by vacuum suction the substrate W and the area of a concavity that forms a vacuum area, and the relationship between the index and the amount of warping of the substrate W when the polishing head was pressed.

Figure 7:
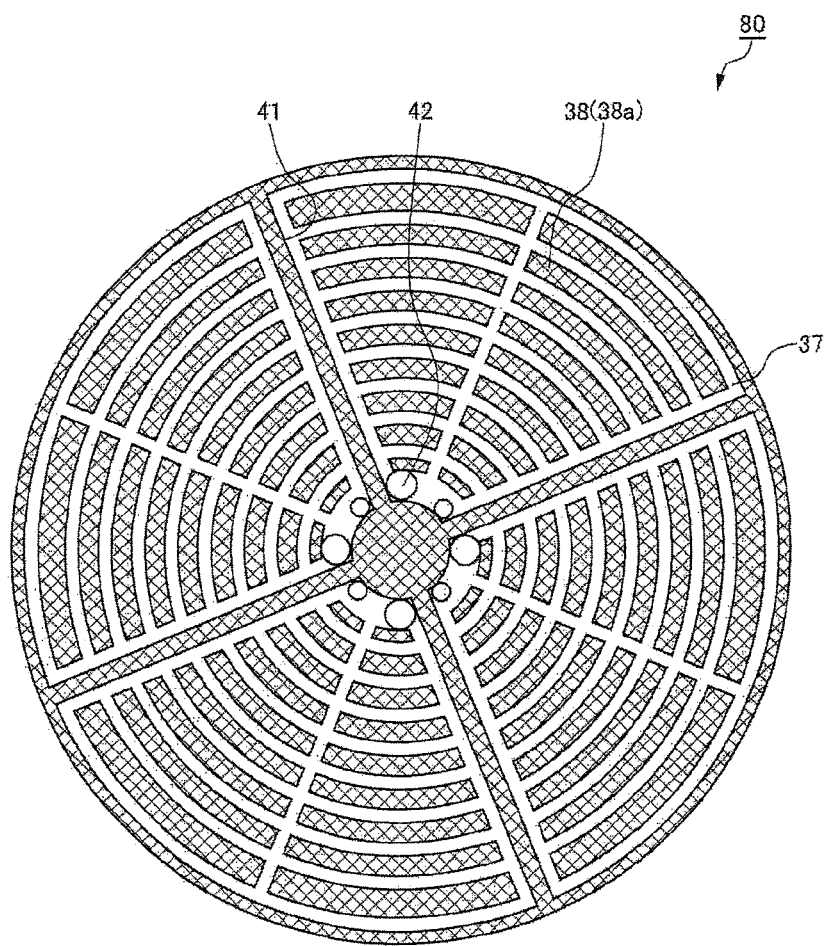
FIG. 7 is a plan view of a conventional vacuum suction pad.
Figure 23:
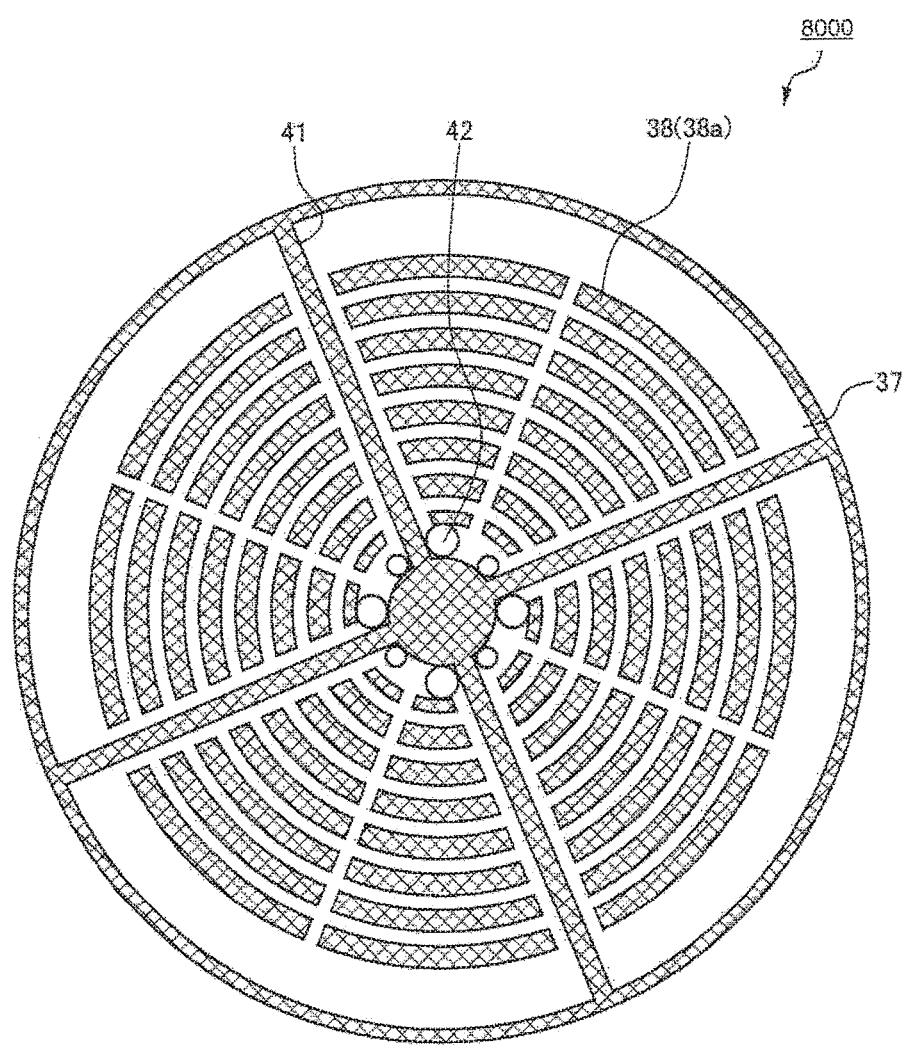
FIG. 23 is a view for explaining the effects of the vacuum suction pad according to the embodiment of the present invention.

FIG. 7 is a view illustrating a conventional vacuum suction pad 80. In the conventional vacuum suction pad, the widths of a plurality of circular arc-shaped substrate holding convexities 38 (substrate holding convexities 38a) are set equal to each other. A vacuum suction pad 8000 in FIG. 23 is obtained by removing the substrate holding convexity 38b on the outermost circumference of the vacuum suction pad 8 illustrated in FIG. 4 (the present embodiment). On the other hand, in a vacuum suction pad 800 of FIG. 8 (a comparative example to FIG. 23), three substrate holding convexities 38a on the inner side of the vacuum suction pad 80 of FIG. 7 are removed.

Figure 8:
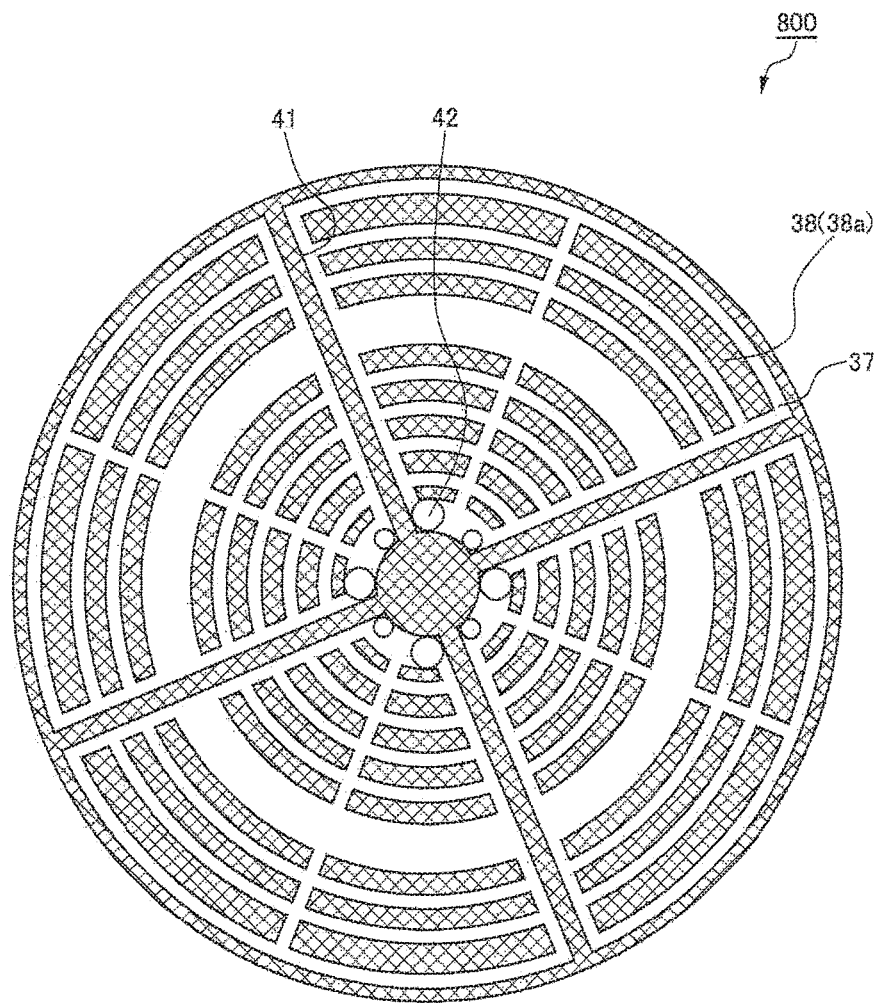
FIG. 8 is a plan view of a vacuum suction pad of a comparative example.

The vacuum suction pad 8000 of FIG. 23 and the vacuum suction pad 800 of FIG. 8 have larger vacuum areas compared to the conventional pad by removing the substrate holding convexities 38b and 38a, respectively, and, as illustrated in FIG. 9, the area of the vacuum area of the vacuum suction pad 8000 (Example in FIG. 9) of FIG. 23 is 112.9% compared to that of the conventional pad, and the area ratio of the vacuum area of the vacuum suction pad 800 is 108.7%.

Figure 10:
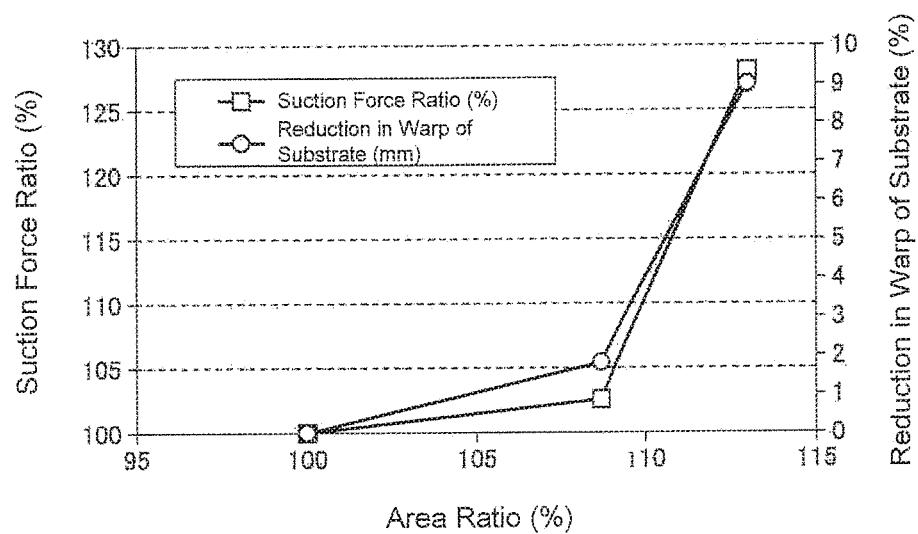
FIG. 10 is a graph showing the effects of the vacuum suction pad according to the embodiment of the present invention.

FIG. 10 illustrates the relationship between the vacuum-area area ratio and the suction force. If suppose that the suction force is increased simply by expanding the area of the vacuum area at the outer circumference or the inner circumference, then the three points in the graph of FIG. 10 will be on a straight line. However, as illustrated in FIG. 10, in practice, at the area ratio of 108.7% (the vacuum suction pad 800 of FIG. 8, Comparative Example in FIG. 9) obtained by expanding the vacuum area on the relatively inner circumferential side, almost no improvement in the suction force was seen, whereas at the area ratio of 112.9% (the vacuum suction pad 8000 of FIG. 23, Example in FIG. 9) obtained by expanding the vacuum area on the outer circumferential side, a rapid increase in the inclination of the line and an improvement of the suction force were seen. It is understandable from this result that "the suction force is significantly increased by especially expanding the vacuum area (narrowing the width of the convexity) in the outer circumferential portion".

FIG. 10 also shows the warp amount of the substrate when the same polishing load was applied under respective conditions. In this case, as shown in FIG. 10, the warp amount is smaller in the form with the area ratio of 112.9% (the vacuum suction pad 8000 of FIG. 23) than in the form with the area ratio of 108.7% (the vacuum suction pad 800 of FIG. 8, Comparative Example in FIG. 9). This result agrees with the tendency of increase and decrease of the suction force. It is thus possible to conclude that "expanding the vacuum area in the outer circumferential portion and reducing the warp amount of the substrate improve the suction force and make it more difficult to separate the substrate".

As described above, it is understood from the results in FIGS. 9 and 10 that, in the case where the area of the concavities was increased by reducing the areas of the substrate holding convexities 38 on the radially inner side and the radially outer side, respectively, the suction force was more improved by increasing the area of the concavities on the radially outer side.

This is due to the fact that the warp amount of the substrate W caused by pressing the polishing head 3 was more reduced when the area of the concavities on the radially outer side was increased. This indicates that narrowing the width W2 on the radially inner side to expand the vacuum area hardly contributes to an improvement of the suction force. This is the reason why only the width W1 on the radially outer side is set narrower in the vacuum suction pad 8 of this embodiment. Moreover, by arranging the substrate holding convexities 38b such that only the width W1 on the radially outer side is narrower as illustrated in FIG. 4, it is possible to prevent a downward warping of the substrate W during vacuum suction compared to the configuration of the vacuum suction pad 8000 of FIG. 23.

According to such a vacuum suction pad 8 of the present embodiment, the width in the radial direction of the substrate holding convexity located on the radially inner side is the same as that of the conventional vacuum suction pad, but the width is set relatively narrower on the outer side and the area of the vacuum portion becomes larger compared to that of the conventional pad. This makes it possible to reduce the amount of upward warping of the substrate due to the force of the polishing head and improve the suction force, and thereby preventing separation of the substrate. At this time, even if the width on the radially inner side is made narrower than that of the conventional pad to expand the area of the vacuum portion on the inner side, almost no influence is exerted on the outer circumferential portion, and the effect cannot be expected. Therefore, by reducing only the width on the radially outer side, it is also possible to minimize the downward warping of the substrate which is caused by narrowing the width.

Further, in this embodiment, since the coating layer which comes into contact with the substrate W has substrate releasability, the substrate W is easily separated after terminating vacuum suction (for example, after polishing the substrate W).

Figure 12:
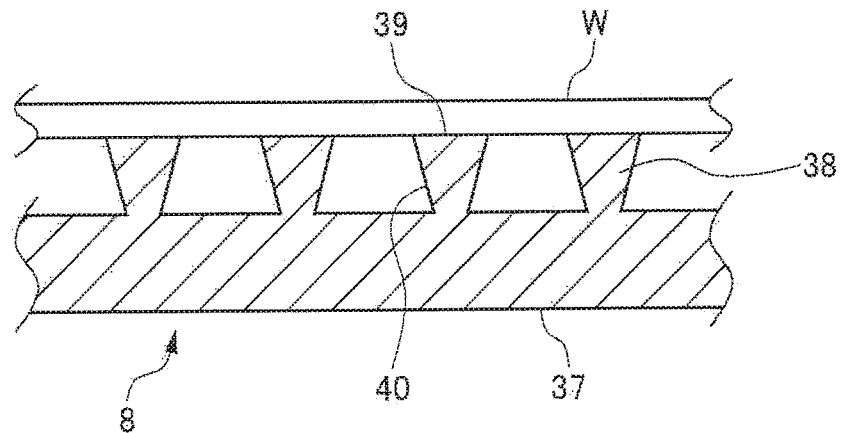
FIG. 12 is a cross-sectional view of a vacuum suction pad according to another embodiment.

For example, FIG. 12 illustrates a modified example of the vacuum suction pad 8. As illustrated in FIG. 12, the width in the radial direction of the contact portion 39 may be set wider than the width in the radial direction of the root portion. According to such a modified example, it is possible to increase the vacuum while keeping the area of contact between the substrate and the vacuum suction pad, and thus it is possible to make it more difficult to separate the substrate while preventing downward warping of the substrate.

Figure 13:
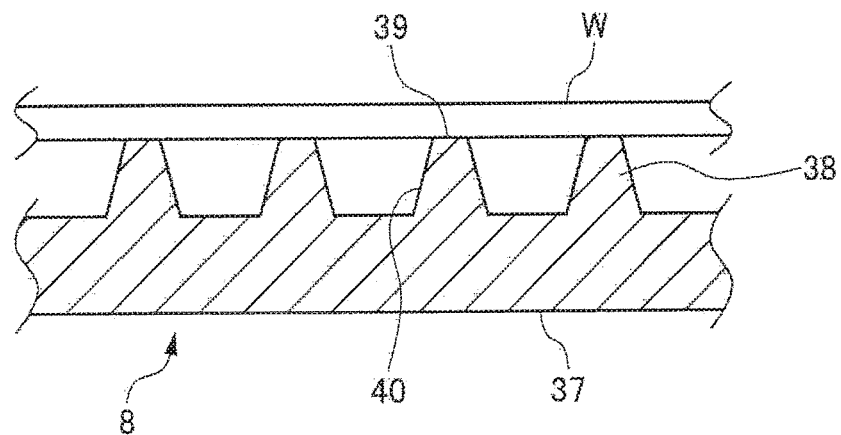
FIG. 13 is a cross-sectional view of a vacuum suction pad according to other embodiment.

FIG. 13 illustrates another modified example of the vacuum suction pad 8. As illustrated in FIG. 13, the width in the radial direction of the contact portion 39 may be set narrower than the width in the radial direction of the root portion. According to such a modified example, the width (area) to be adhered to the substrate is increased, and therefore the substrate is more difficult to separate when an upward force is applied to the substrate.

Figure 14:
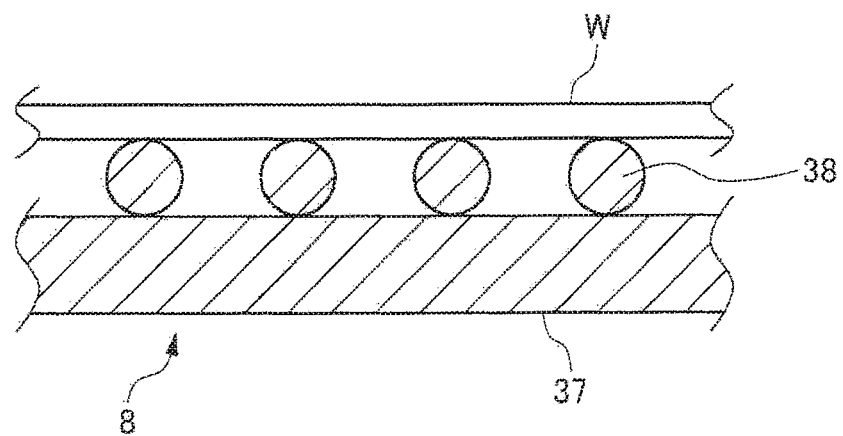
FIG. 14 is a cross-sectional view of a vacuum suction pad according to other embodiment.

FIG. 14 illustrates other modified example of the vacuum suction pad 8. As illustrated in FIG. 14, the substrate holding convexity 38 may have a circular cross-sectional shape. According to such a modified example, it is possible to make it more difficult to separate a substrate, particularly a substrate which is less susceptible to downward warping, while decreasing the degree of contamination on the rear surface of the substrate by reducing the area of contact between the substrate and the vacuum suction pad.

Figure 15:
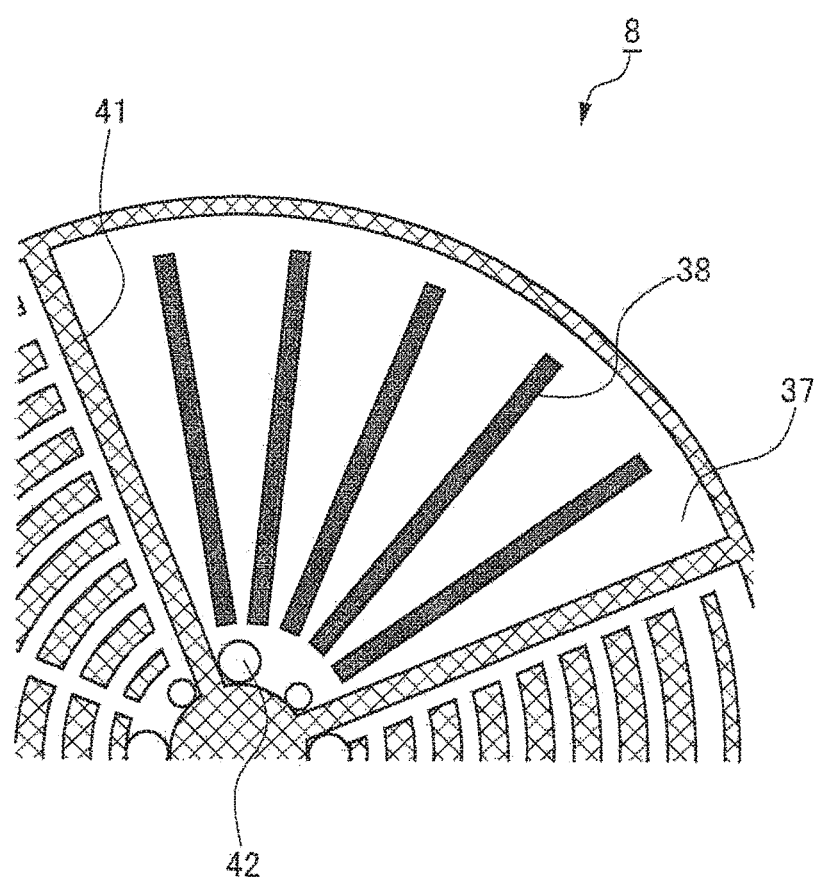
FIG. 15 is a plan view of a vacuum suction pad according to other embodiment.

FIG. 15 illustrates other modified example of the vacuum suction pad 8. As illustrated in FIG. 15, the substrate holding convexities 38 may be arranged radially in a certain vacuum suction area. According to such a modified example, the area of contact between the substrate and the pad is smaller compared to that of the conventional pad, thereby making it possible to prevent upward warping and adhesion of particles to the rear surface of the substrate.

Figure 16:
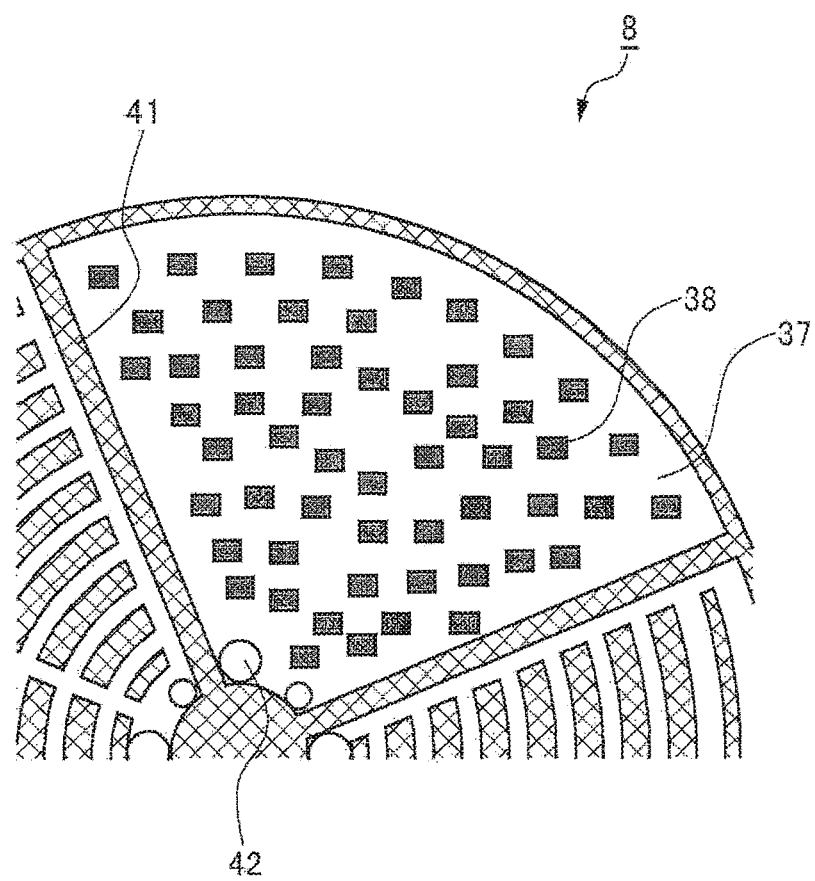
FIG. 16 is a plan view of a vacuum suction pad according to other embodiment.

FIG. 16 illustrates other modified example of the vacuum suction pad 8. As illustrated in FIG. 16, the substrate holding convexities 38 may be provided in the form of floating islands in a certain vacuum suction area. According to such a modified example, it is possible to prevent upward warping because the area of adhesion is smaller than that of the conventional pad, and it is also possible to prevent downward warping because the contact surfaces with the substrate are scattered.

Figure 17:
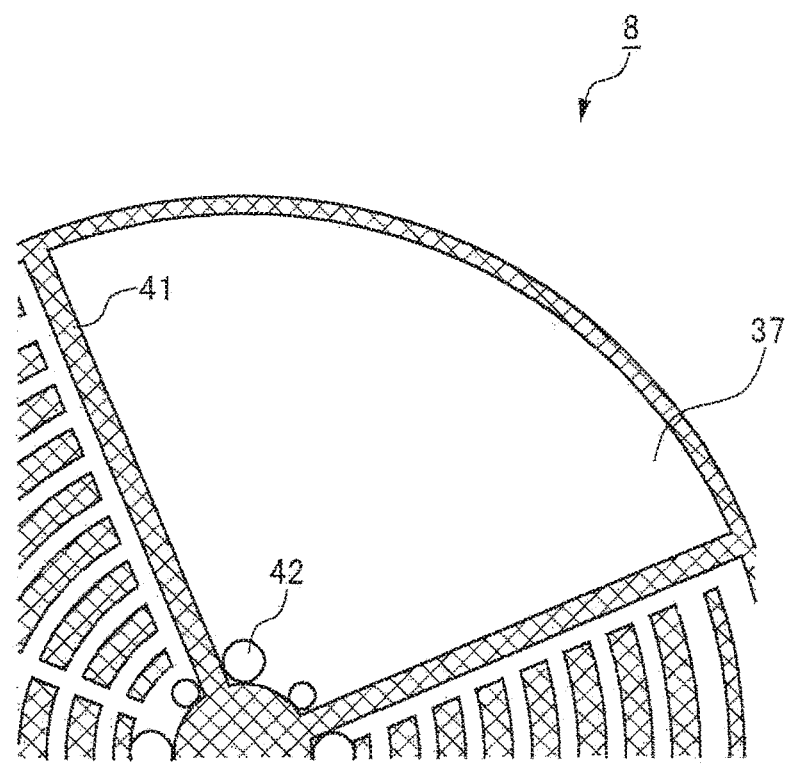
FIG. 17 is a plan view of a vacuum suction pad according to other embodiment.

FIG. 17 illustrates other modified example of the vacuum suction pad 8. As illustrated in FIG. 17, the substrate holding convexities 38 may not be provided in a certain vacuum suction area. According to such a modified example, the area of contact with the substrate can be reduced, thereby making it possible to prevent upward warping and adhesion of particles to the rear surface of the substrate.

Second Embodiment

Figure 18:
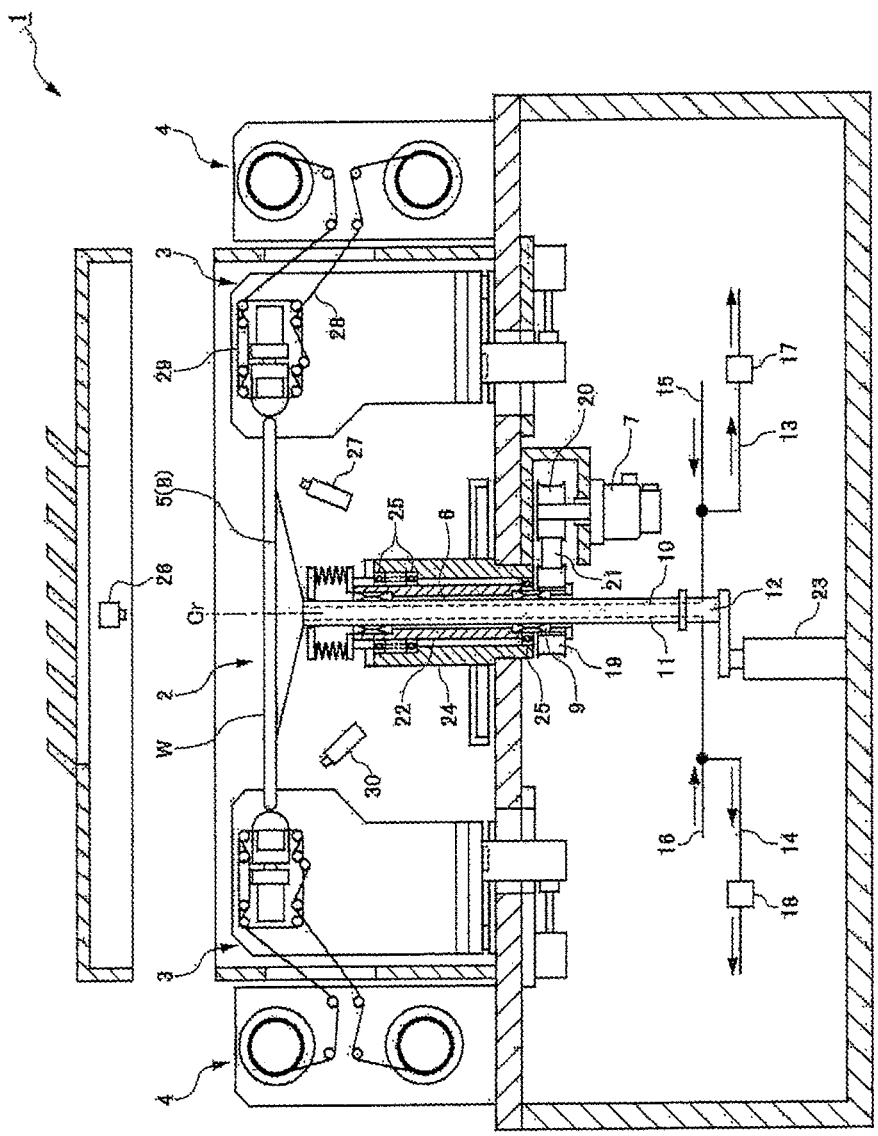
FIG. 18 is a cross-sectional view of a polishing apparatus including a substrate holder according to an embodiment of the present invention.

Next, the configuration of a substrate holder according to the second embodiment of the present invention will be described with reference to the drawings. FIG. 18 is a cross-sectional view of a polishing apparatus including the substrate holder of this embodiment. As illustrated in FIG. 18, a first tube 10 and a second tube 11 are inserted through the inside of a rotating shaft 6 of a substrate holder 2. The first tube 10 and the second tube 11 are connected to a first vacuum line 13 and a second vacuum line 14, which are vacuum sources, respectively, through a rotary joint 12 attached to the lower end of the rotating shaft 6. The first tube 10 and the second tube 11 are also connected a first nitrogen gas supply line 15 and a second nitrogen gas supply line 16 which are fluid supply sources for releasing a substrate W from a vacuum suction pad 8 after a process.

A first vacuum regulator 17 and a second vacuum regulator 18 are attached to the first vacuum line 13 and the second vacuum line 14, respectively, to adjust the degree of vacuum according to a signal from a control unit (not shown). The substrate holder 2 is configured to selectively connect the first vacuum line 13 or the first nitrogen gas supply line 15 to the first tube 10, and/or selectively connects the second vacuum line 14 or the second nitrogen gas supply line 16 to the second tube 11 so that the substrate W is attracted by vacuum suction to, or released from, the top surface of the vacuum suction pad 8.

Figure 19:
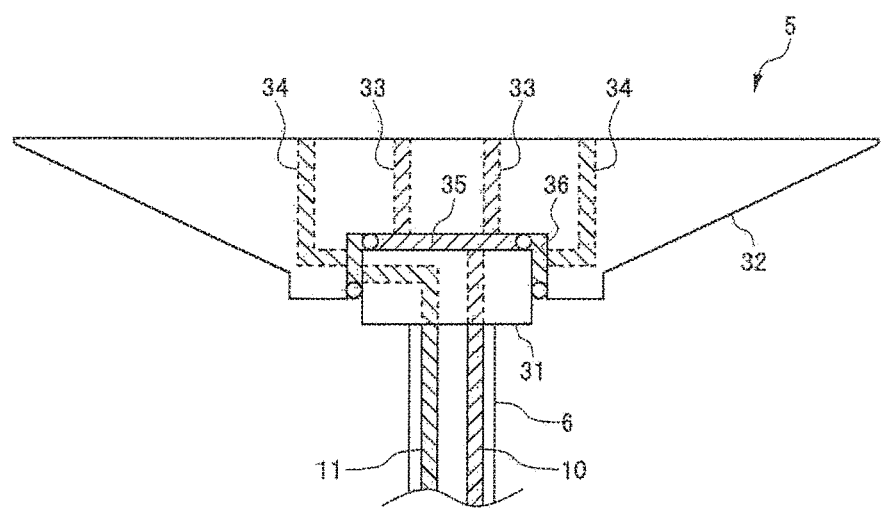
FIG. 19 is an explanatory view of a stage of the substrate holder according to the embodiment of the present invention.

FIG. 19 is a cross-sectional view for describing the configuration of a stage 5 of the substrate holder 2. As illustrated in FIG. 19, the stage 5 of the substrate holder 2 includes a base portion 31 to which the first tube 10 and the second tube 11 are connected, and a stage portion 32 supported by the base portion 31. The base portion 31 and the stage portion 32 are rotatable together with the rotating shaft 6 of the substrate holder 2. Moreover, a first intake/exhaust line 33 and a second intake/exhaust line 34 are formed inside the stage portion 32. In this case, the first intake/exhaust line is located on the radially inner side, and the second intake/exhaust line is arranged on the radially outer side. Additionally, a first connection space 35 and a second connection space 36 are formed between the base portion 31 and the stage portion 32. The first intake/exhaust line is connected to the first tube 10 through the first connection space 35, and the second intake/exhaust line is connected to the second tube 11 through the second connection space 36.

Figure 20:
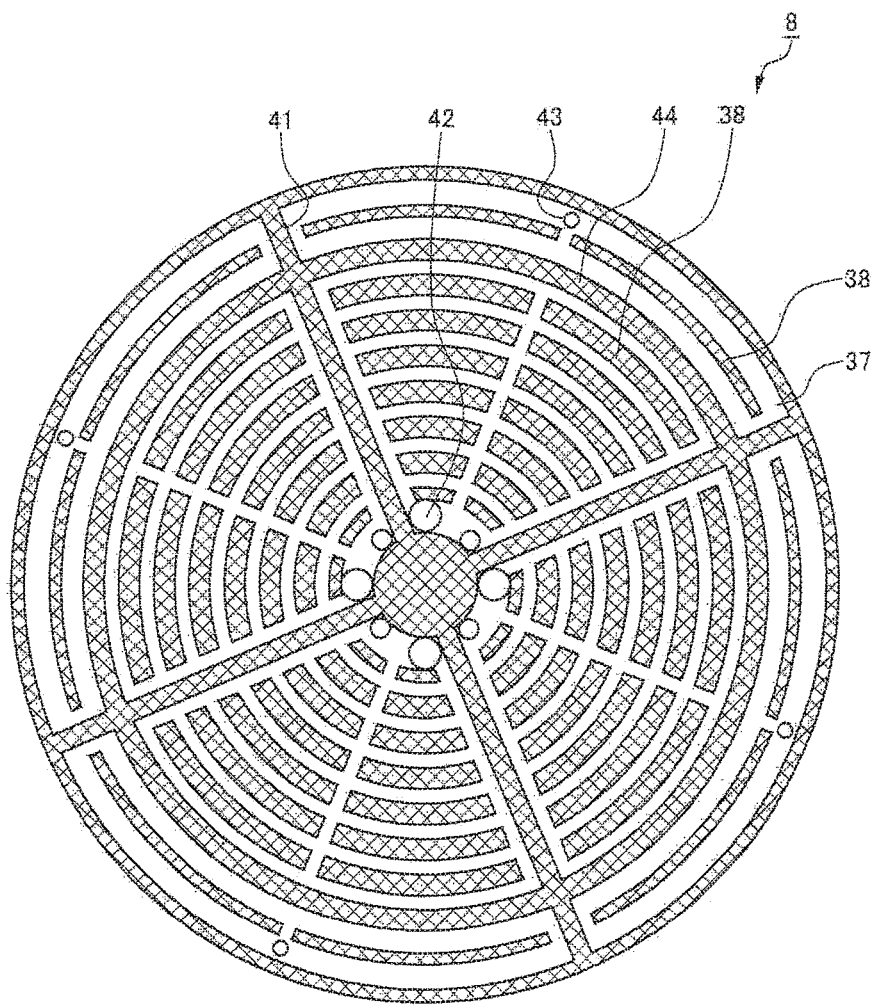
FIG. 20 is a plan view (schematic view) of a vacuum suction pad according to other embodiment.
Figure 21:
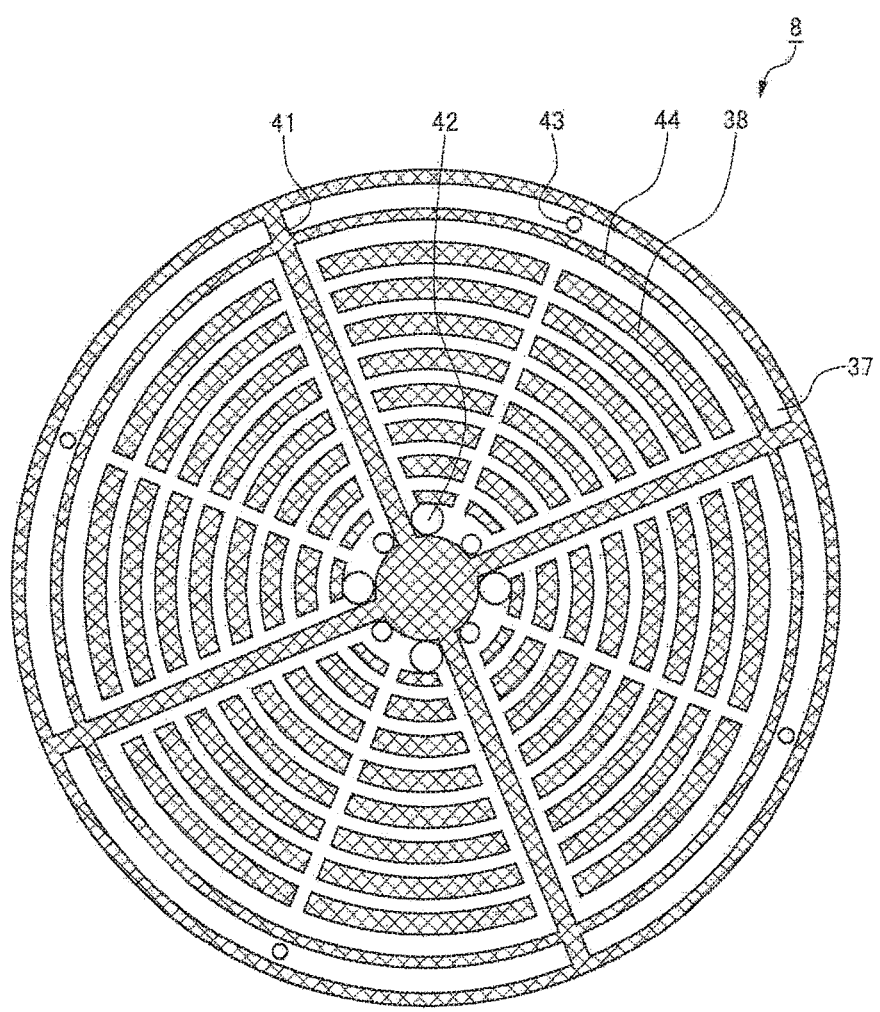
FIG. 21 is a plan view (schematic view) of a vacuum suction pad according to other embodiment.
Figure 22:
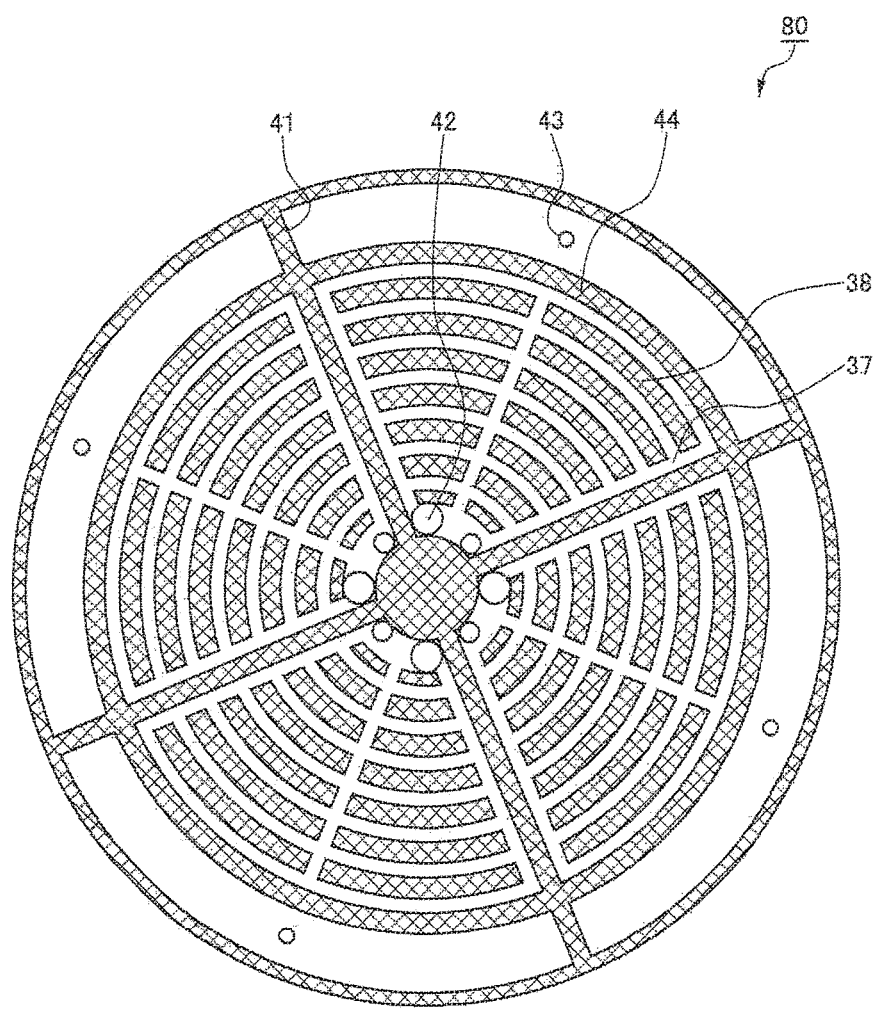
FIG. 22 is a plan view (schematic view) of a vacuum suction pad according to other embodiment.

Next, the configuration of the vacuum suction pad 8 of this embodiment will be described. As illustrated in FIGS. 20 to 22, an area forming convexity 41 not only divides the top surface of a pad main body 37 in a circumferential direction, but also further divides the top surface of the pad main body 37 in a radial direction with a convexity 44 positioned in the radial direction. In the examples of FIGS. 20 to 22, the top surface of the pad main body 37 is divided in the circumferential direction by the area forming convexity 41 and is also divided in the radial direction by the convexity 44 positioned in the radial direction so that eight vacuum suction areas in total (four vacuum suction areas on the radially inner side and four vacuum suction areas on the radially outer side) are formed. In this case, each of the vacuum suction areas on the radially outer side is provided with a first intake/exhaust port 42 to be connected to the first intake/exhaust line 33 of the substrate holder 2, and each of the vacuum suction areas on the radially inner side is provided with a second intake/exhaust port 43 to be connected to the second intake/exhaust line 34 of the substrate holder 2.

According to the second embodiment, the suction force for attracting the substrate W by vacuum suction may be different in the vacuum suction areas on the radially outer side and in the vacuum suction areas on the radially inner side. Therefore, by increasing the suction force on the radially outer side of the substrate W so as to be greater than the suction force on the radially inner side, the radially outer side of the substrate W is more difficult to separate when the substrate W is held by vacuum suction (for example, during polishing of the substrate W).

Although the embodiments of the present invention have been described by way of examples, the scope of the present invention is not limited to these examples, and it is possible to change and modify the embodiments according to purposes within the scope described in the claims.

As described above, a vacuum suction pad according to the present invention has the effect of making it more difficult to separate a substrate when the substrate is held by vacuum suction, is used for an apparatus for polishing substrates, such as semiconductor wafers, and is useful.

REFERENCE SIGNS LIST

1 Polishing apparatus
2 Substrate holder
5 Stage
8 Vacuum suction pad
33 First intake/exhaust line
34 Second intake/exhaust line
37 Pad main body
38(38a, 38b) Substrate holding convexities
39 Contact portion
40 Root portion
41 Area forming convexity
42 First intake/exhaust port
43 Second intake/exhaust port
W Substrate

What is claimed is:

1. A vacuum suction pad comprising:
a pad main body having a lower surface adhered to a stage of a substrate holder; and
a plurality of circular arc-shaped substrate holding convexities, provided on a top surface of the pad main body, for holding a substrate which is attracted by vacuum suction to the top surface of the pad main body, wherein
the plurality of circular arc-shaped substrate holding convexities are arranged concentrically with the pad main body having a circular shape, and
a width, in a radial direction, of a substrate holding convexity located on a radially outer side among the plurality of circular arc-shaped substrate holding convexities is narrower than a width, in the radial direction, of a substrate holding convexity located on a radially inner side, wherein
an outermost substrate holding convexity among the plurality of circular arc-shaped substrate holding convexities has a narrowest width among the plurality of circular arc-shaped substrate holding convexities, and
a width E, in the radial direction, between the outermost substrate holding convexity and an outer convexity next to the outermost substrate holding convexity is greater than a width C, in the radial direction, between two inner substrate holding convexities among the plurality of circular arc-shaped substrate holding convexities.

2. The vacuum suction pad according to claim 1, wherein a coating layer having substrate releasability is formed on the top surface of the pad main body.

3. The vacuum suction pad according to claim 1, further comprising an area forming convexity, provided on the top surface of the pad main body, for dividing the top surface of the pad main body into a plurality of vacuum suction areas in the radial direction, wherein
the vacuum suction area on the radially outer side is provided with a first intake/exhaust port, and
the vacuum suction area on the radially inner side is provided with a second intake/exhaust port.

4. The vacuum suction pad according to claim 1, wherein the substrate holding convexities include a contact portion that comes into contact with the substrate, and a root portion that supports the contact portion, and
a width, in the radial direction, of the contact portion is set wider than a width, in the radial direction, of the root portion.

5. The vacuum suction pad according to claim 1, wherein the substrate holding convexities include a contact portion that comes into contact with the substrate, and a root portion that supports the contact portion, and
a width, in the radial direction, of the contact portion is set narrower than a width, in the radial direction, of the root portion.

6. The vacuum suction pad according to claim 1, wherein the substrate holding convexity has a circular cross-sectional shape.

7. The vacuum suction pad according to claim 1, wherein the width, in the radial direction, of each of the substrate holding convexities located on the radially inner side is approximately the same.

8. The vacuum suction pad according to claim 1, wherein the width, in a radial direction, of the substrate holding convexity located on the radially most outer side is narrower than the width, in the radial direction, of the other substrate holding convexity.

9. The vacuum suction pad according to claim 1, wherein the width E and a distance D between the outermost substrate holding convexity and a substrate holding convexity located inwardly next to the outermost substrate holding convexity are greater than the width C.

10. The vacuum suction pad according to claim 1, wherein the width of the outermost substrate holding convexity is smaller than a width of a substrate holding convexities located further inward.

11. A vacuum suction pad comprising:
a pad main body having a lower surface adhered to a stage of a substrate holder;
a plurality of circular arc-shaped substrate holding convexities, provided on a top surface of the pad main body, for holding a substrate which is attracted by vacuum suction to the top surface of the pad main body; and
an area forming convexity, provided on the top surface of the pad main body, for dividing the top surface of the pad main body into a plurality of vacuum suction areas in the radial direction,
wherein the plurality of circular arc-shaped substrate holding convexities are arranged concentrically with the pad main body having a circular shape,
wherein the vacuum suction area on the radially outer side is provided with a first intake/exhaust port,
wherein the vacuum suction area on the radially inner side is provided with a second intake/exhaust port,
wherein a width, in a radial direction, of a substrate holding convexity located on a radially outer side among the plurality of circular arc-shaped substrate holding convexities is narrower than a width, in the radial direction, of a substrate holding convexity located on a radially inner side,
wherein an outermost substrate holding convexity among the plurality of circular arc-shaped substrate holding convexities has a narrowest width among the plurality of circular arc-shaped substrate holding convexities, and
wherein a width E, in the radial direction, between the outermost substrate holding convexity and an outer convexity next to the outermost substrate holding convexity is greater than a width C, in the radial direction, between two inner substrate holding convexities among the plurality of circular arc-shaped substrate holding convexities.

12. The vacuum suction pad according to claim 11, wherein the area forming convexity is provided into the radially outer side of the pad main body.

13. The vacuum suction pad according to claim 11, wherein the width, in the radial direction, of each of the circular arc-shaped substrate holding convexities is approximately the same.

14. A substrate holder comprising:
a stage for holding a substrate; and
a vacuum suction pad adhered to the stage, wherein the vacuum suction pad includes:
a pad main body having a lower surface adhered to the stage; and
a plurality of circular arc-shaped substrate holding convexities, provided on a top surface of the pad main body, for holding a substrate which is attracted by vacuum suction to the top surface of the pad main body, wherein
the plurality of circular arc-shaped substrate holding convexities are arranged concentrically with the pad main body having a circular shape, and
a width, in a radial direction, of the substrate holding convexity located on a radially outer side among the plurality of circular arc-shaped substrate holding convexities is narrower than a width, in the radial direction, of the substrate holding convexity located on a radially inner side, wherein
an outermost substrate holding convexity among the plurality of circular arc-shaped substrate holding convexities has a narrowest width among the plurality of circular arc-shaped substrate holding convexities, and
a width E, in the radial direction, between the outermost substrate holding convexity and an outer convexity next to the outermost substrate holding convexity is greater than a width C, in the radial direction, between two inner substrate holding convexities among the plurality of circular arc-shaped substrate holding convexities.

15. The substrate holder according to claim 14, further comprising a first intake/exhaust line and a second intake/exhaust line, and
wherein the vacuum suction pad further including: an area forming convexity, provided on the top surface of the pad main body, for dividing the top surface of the pad main body into a plurality of vacuum suction areas in the radial direction, and
wherein
the vacuum suction area on the radially outer side is provided with a first intake/exhaust port to be connected to the first intake/exhaust line of the substrate holder, and
the vacuum suction area on the radially inner side is provided with a second intake/exhaust port to be connected to the second intake/exhaust line of the substrate holder.

* * * * *